(12) United States Patent
Kim et al.

(10) Patent No.: US 12,219,856 B2
(45) Date of Patent: Feb. 4, 2025

(54) DISPLAY DEVICE AND METHOD FOR MANUFACTURING THE SAME

(71) Applicant: SAMSUNG DISPLAY CO., LTD., Yongin-si (KR)

(72) Inventors: Jin-Yup Kim, Cheonan-si (KR); Deukjong Kim, Cheonan-si (KR); Hagyeong Song, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/349,943

(22) Filed: Jul. 10, 2023

(65) Prior Publication Data

US 2023/0363237 A1    Nov. 9, 2023

Related U.S. Application Data

(62) Division of application No. 16/855,646, filed on Apr. 22, 2020, now Pat. No. 11,700,758.

(30) Foreign Application Priority Data

Jul. 22, 2019    (KR) .................. 10-2019-0088190

(51) Int. Cl.
*H10K 59/40* (2023.01)
*H01L 27/12* (2006.01)
(Continued)

(52) U.S. Cl.
CPC .......... *H10K 59/40* (2023.02); *H01L 27/124* (2013.01); *H01L 27/1248* (2013.01);
(Continued)

(58) Field of Classification Search
CPC .. H10K 59/40; H10K 59/1201; H10K 59/131; H10K 71/00; H10K 2102/00;
(Continued)

(56) References Cited

U.S. PATENT DOCUMENTS 9,482,917 B2   11/2016   Park et al.
10,665,661 B2   5/2020   Park et al.
(Continued)

FOREIGN PATENT DOCUMENTS

CN        109671741 A      4/2019
EP        3343336 A1       7/2018
(Continued)

*Primary Examiner* — Michael M Trinh
(74) *Attorney, Agent, or Firm* — Lewis Roca Rothgerber Christie LLP

(57) ABSTRACT

A display device includes: a light-emitting element at a display area; a driving element electrically connected to the light-emitting element; an encapsulation layer covering the light-emitting element; a touch sensor on the encapsulation layer; a connection pad at a bonding area, the connection pad including a lower conductive layer, an intermediate conductive layer on the lower conductive layer, and an upper conductive layer on the intermediate conductive layer; a cladding layer covering at least a side surface of the intermediate conductive layer and including an organic material; a passivation layer covering an upper surface of the cladding layer and including an inorganic material, a portion of the passivation layer being located under the upper conductive layer; and a driving circuit attached to the connection pad.

7 Claims, 13 Drawing Sheets

(51) Int. Cl.
  *H10K 50/84* (2023.01)
  *H10K 59/12* (2023.01)
  *H10K 59/131* (2023.01)
  *H10K 71/00* (2023.01)
  *H10K 102/00* (2023.01)
(52) U.S. Cl.
  CPC ......... *H10K 50/84* (2023.02); *H10K 59/1201* (2023.02); *H10K 59/131* (2023.02); *H10K 71/00* (2023.02); *H10K 2102/00* (2023.02)
(58) Field of Classification Search
  CPC ... H10K 50/84; G06F 3/04164; G06F 3/0412; H01L 27/1248; H01L 27/124
  See application file for complete search history.

(56) References Cited

U.S. PATENT DOCUMENTS

| | | | |
|---|---|---|---|
| 2011/0000705 A1* | 1/2011 | Moriwaki | H05B 33/04 174/258 |
| 2013/0222351 A1 | 8/2013 | Kao et al. | |
| 2016/0064427 A1* | 3/2016 | Park | G06F 3/0412 438/34 |
| 2017/0221981 A1 | 8/2017 | Tsuruoka | |
| 2017/0352706 A1 | 12/2017 | Choi et al. | |
| 2017/0358642 A1 | 12/2017 | Jo et al. | |
| 2018/0039360 A1 | 2/2018 | Akimoto et al. | |
| 2018/0095584 A1* | 4/2018 | Lee | H10K 50/805 |
| 2018/0097047 A1 | 4/2018 | Jung et al. | |
| 2018/0182821 A1* | 6/2018 | Yun | H10K 59/131 |
| 2018/0358413 A1 | 12/2018 | Lee et al. | |
| 2019/0012031 A1* | 1/2019 | Kim | H10K 59/38 |
| 2019/0157630 A1 | 5/2019 | Kwon et al. | |
| 2019/0163304 A1 | 5/2019 | Shim et al. | |
| 2020/0235169 A1 | 7/2020 | Miyamoto et al. | |
| 2020/0350390 A1* | 11/2020 | Kim | G02F 1/13458 |
| 2023/0060805 A1 | 3/2023 | Kim et al. | |

FOREIGN PATENT DOCUMENTS

| | | |
|---|---|---|
| EP | 3496149 A1 | 6/2019 |
| JP | 2015-72764 A | 4/2015 |
| JP | 2015-519588 A | 7/2015 |
| JP | 2018-6749 A | 1/2018 |
| KR | 10-2005-0097000 A | 10/2005 |
| KR | 10-2015-0073297 A | 7/2015 |
| KR | 10-2018-0015326 A | 2/2018 |

* cited by examiner

DISPLAY DEVICE AND METHOD FOR MANUFACTURING THE SAME

CROSS-REFERENCE TO RELATED APPLICATIONS

This application is a divisional of U.S. patent application Ser. No. 16/855,646, filed Apr. 22, 2020, which claims priority to and the benefit of Korean Patent Application No. 10-2019-0088190, filed Jul. 22, 2019, the entire content of both of which is incorporated herein by reference.

BACKGROUND

1. Field

Aspects of exemplary embodiments of the present inventive concept relate to a display device. More particularly, aspects of exemplary embodiments of the present inventive concept relate to a display device, and a method for manufacturing a display device.

2. Description of the Related Art

An organic light-emitting display device is a display device capable of emitting light for itself (e.g., without using a backlight or the like). Because the organic light-emitting display device may have reduced weight and thickness, and may have characteristics that are appropriate for a flexible display device, usage of the organic light-emitting display device has increased.

The organic light-emitting display device includes an array of light-emitting elements, and a driving part (e.g., a driver or a driving circuit) for providing a driving signal to the light-emitting elements. A driving circuit of the driving part may be disposed in a driving chip. The driving chip (or a circuit board combined with the driving chip) may be combined with a substrate of the organic light-emitting display device.

The driving chip may be bonded to the substrate by hot pressing or the like. During the bonding process (or after the bonding process), bonding defects may be caused, and thus, reliability of a display device may be reduced.

The above information disclosed in this Background section is for enhancement of understanding of the background of the inventive concept, and therefore, it may contain information that does not constitute prior art.

SUMMARY

One or more exemplary embodiments of the present inventive concept are directed to a display device with improved reliability.

One or more exemplary embodiments of the present inventive concept are directed to a method for manufacturing the display device.

According to an exemplary embodiment of the present inventive concept, a display device includes: a light-emitting element at a display area; a driving element electrically connected to the light-emitting element; an encapsulation layer covering the light-emitting element; a touch sensor on the encapsulation layer; a connection pad at a bonding area, the connection pad including a lower conductive layer, an intermediate conductive layer on the lower conductive layer, and an upper conductive layer on the intermediate conductive layer; a cladding layer covering at least a side surface of the intermediate conductive layer and including an organic material; a passivation layer covering an upper surface of the cladding layer and including an inorganic material, a portion of the passivation layer being located under the upper conductive layer; and a driving circuit attached to the connection pad.

In an exemplary embodiment, the driving element may include: a gate metal pattern including a gate electrode; and a source metal pattern including a drain electrode, or a connection electrode electrically connecting the drain electrode to the light-emitting element, and the touch sensor may include a sensing conductive pattern.

In an exemplary embodiment, the lower conductive layer may be formed from a same layer as that of the gate metal pattern, the intermediate conductive layer may be formed from a same layer as that of the source metal pattern, and the upper conductive layer may be formed from a same layer as that of the sensing conductive pattern.

In an exemplary embodiment, the source metal pattern may include a first source metal pattern including the drain electrode, and a second source metal pattern including the connection electrode, and the intermediate conductive layer may include a first intermediate conductive layer formed from a same layer as that of the first source metal pattern, and a second intermediate conductive layer formed from a same layer as that of the second source metal pattern.

In an exemplary embodiment, the connection pad may further include a third intermediate conductive layer between the second intermediate conductive layer and the upper conductive layer.

In an exemplary embodiment, the touch sensor may include: a lower touch insulation layer; a first sensing conductive pattern on the lower touch insulation layer; a touch intermediate insulation layer covering the first sensing conductive pattern; and a second sensing conductive pattern on the touch intermediate insulation layer, and the upper conductive layer may be formed from a same layer as that of the second sensing conductive pattern.

In an exemplary embodiment, the passivation layer may be formed from a same layer as that of the lower touch insulation layer, the touch intermediate insulation layer, or a combination thereof.

In an exemplary embodiment, the cladding layer may be formed from an organic insulation layer covering the source metal pattern, and a thickness of the cladding layer may be less than that of the organic insulation layer.

In an exemplary embodiment, the thickness of the cladding layer may be less than or equal to 1 µm.

In an exemplary embodiment, the intermediate conductive layer may have a multi-layered structure including an aluminum-containing layer.

In an exemplary embodiment, a first electrode of the light-emitting element may include silver.

In an exemplary embodiment, the connection pad may be electrically connected to the driving circuit through a conductive bonding member that contacts the upper conductive layer.

According to an exemplary embodiment of the present inventive concept, a display device includes: a pixel array at a display area; a connection pad at a bonding area, the connection pad including a lower conductive layer, an intermediate conductive layer on the lower conductive layer, and an upper conductive layer on the intermediate conductive layer; a cladding layer covering at least a side surface of the intermediate conductive layer and including an organic material; a passivation layer covering an upper surface of the cladding layer and including an inorganic material, a portion of the passivation layer being located under the upper conductive layer; and a driving circuit attached to the connection pad.

In an exemplary embodiment, the pixel array may include a light-emitting element, and a driving element electrically connected to the light-emitting element; the driving element may include: a gate metal pattern including a gate electrode; and a source metal pattern including: a drain electrode; or a connection electrode electrically connecting the drain electrode to the light-emitting element; a touch sensor may be on the pixel array and may include a sensing conductive pattern; and the lower conductive layer may be formed from a same layer as that of the gate metal pattern, the intermediate conductive layer may be formed from a same layer as that of the source metal pattern, and the upper conductive layer may be formed from a same layer as that of the sensing conductive pattern.

In an exemplary embodiment, the cladding layer may be formed from an organic insulation layer covering the source metal pattern, and a thickness of the cladding layer may be less than that of the organic insulation layer.

In an exemplary embodiment, the intermediate conductive layer may have a multi-layered structure including an aluminum-containing layer.

According to an exemplary embodiment of the present inventive concept, a method for manufacturing a display device including a light-emitting element at a display area, a driving element electrically connected to the light-emitting element, and a connection pad at a bonding area, is provided. The method includes: forming a lower conductive layer of the connection pad; forming an intermediate conductive layer of the connection pad to electrically contact the lower conductive layer; forming a cladding layer to cover a side surface of the intermediate conductive layer while exposing an upper surface of the intermediate conductive layer; forming a passivation layer to cover an upper surface of the cladding layer; and forming an upper conductive layer of the connection pad to electrically contact the intermediate conductive layer.

In an exemplary embodiment, the lower conductive layer may be formed from a same layer as that of a gate electrode of the driving element; and the intermediate conductive layer may be formed from a same layer as that of a drain electrode of the driving element, or as that of a connection electrode electrically connecting the drain electrode to the light-emitting element.

In an exemplary embodiment, the display device may further include: an encapsulation layer covering the light-emitting element; and a touch sensor on the encapsulation layer and including a sensing conductive pattern, and the upper conductive layer may be formed from a same layer as that of the sensing conductive pattern.

In an exemplary embodiment, the touch sensor may include: a lower touch insulation layer; a first sensing conductive pattern on the lower touch insulation layer; a touch intermediate insulation layer covering the first sensing conductive pattern; and a second sensing conductive pattern on the touch intermediate insulation layer, and the upper conductive layer may be formed from a same layer as that of the second sensing conductive pattern.

In an exemplary embodiment, the passivation layer may be formed from a same layer as that of the lower touch insulation layer, the touch intermediate insulation layer, or a combination thereof.

In an exemplary embodiment, the cladding layer may be formed from an organic insulation layer covering a source metal pattern of the driving element, and the cladding layer may have a thickness less than that of the organic insulation layer.

In an exemplary embodiment, the intermediate conductive layer may have a multi-layered structure including an aluminum-containing layer.

According to one or more exemplary embodiments of the present inventive concept, a cladding layer may be formed at (e.g., in or on) a bonding area to prevent or reduce exposure of a conductive layer including aluminum. Thus, particles due to a reduction of metal ions may be prevented or substantially prevented. Furthermore, a thickness of the cladding layer including an organic material may be reduced, and the cladding layer may be passivated by an inorganic layer. Thus, boding defects may be prevented or reduced, and reliability of the display device may be improved.

BRIEF DESCRIPTION OF THE DRAWINGS

The above and other aspects and features of the present inventive concept will be more clearly understood from the following detailed description of the illustrative, non-limiting exemplary embodiments with reference to the accompanying drawings.

DETAILED DESCRIPTION

Figure 1:
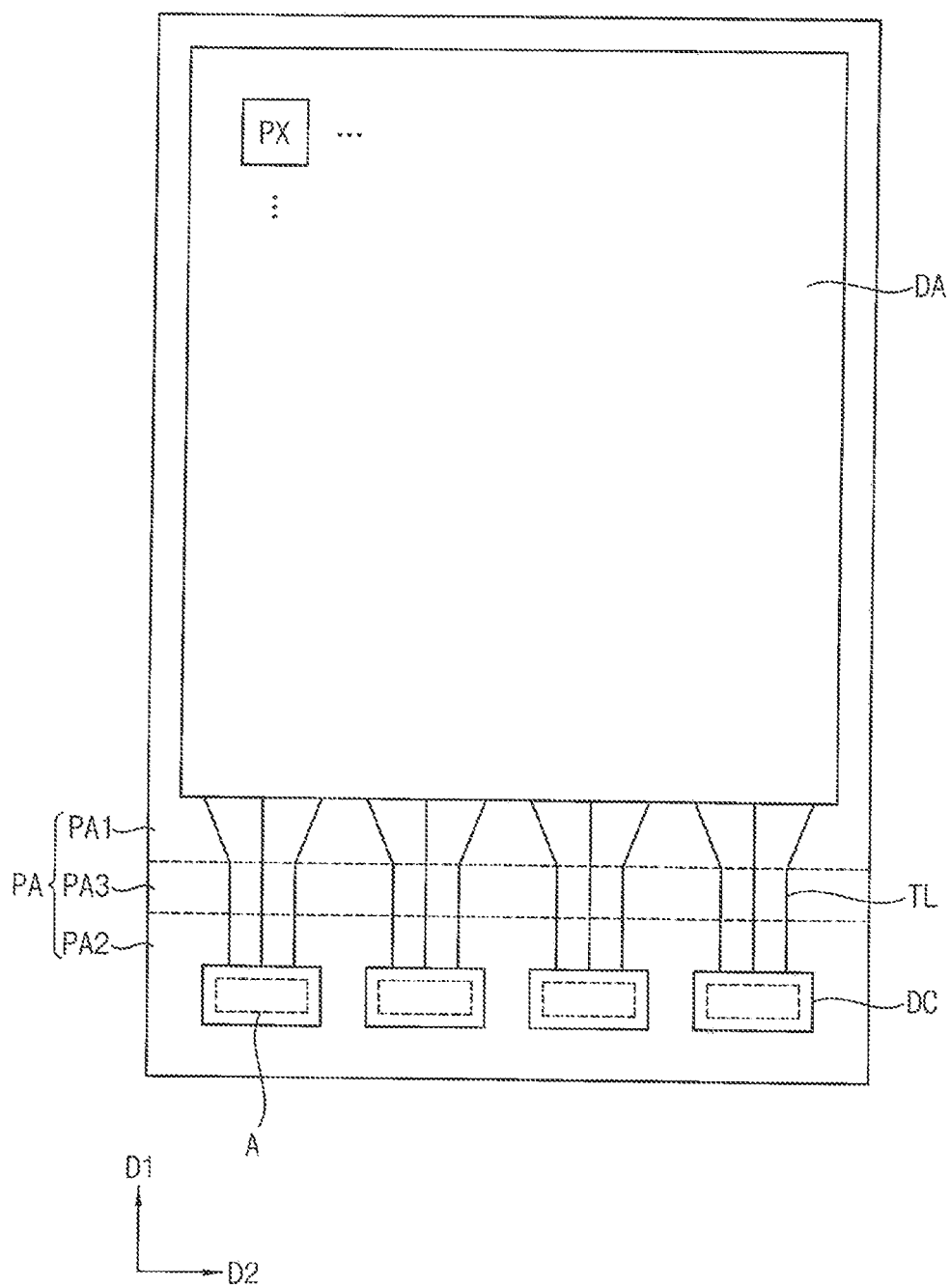
FIG. 1 is a plan view illustrating a display device according to an exemplary embodiment.

Hereinafter, a display device and a method for manufacturing the display device according to exemplary embodiments of the present inventive concept will be described in more detail with reference to the accompanying drawings, in which some exemplary embodiments are shown. The present inventive concept, however, may be embodied in various different forms, and should not be construed as being limited to only the illustrated embodiments herein. Rather, these embodiments are provided as examples so that this disclosure will be thorough and complete, and will fully convey the aspects and features of the present inventive concept to those skilled in the art. Accordingly, processes, elements, and techniques that are not necessary to those having ordinary skill in the art for a complete understanding of the aspects and features of the present inventive concept may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below,"

"lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present inventive concept.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present inventive concept. As used herein, the singular forms "a" and "an" are intended to include the plural forms as well, unless the context clearly indicates otherwise. It will be further understood that the terms "comprises," "comprising," "includes," and "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present inventive concept refers to "one or more embodiments of the present inventive concept." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
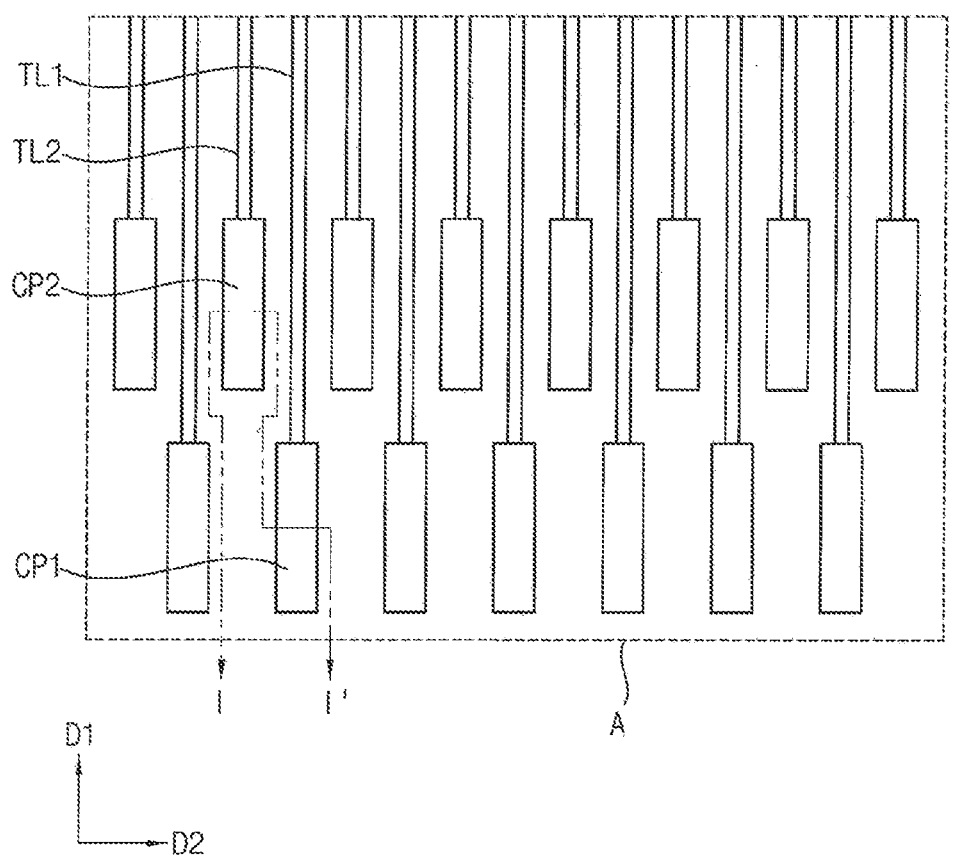
FIG. 2 is an enlarged plan view illustrating the region A of FIG. 1.

FIG. 1 is a plan view illustrating a display device according to an exemplary embodiment. FIG. 2 is an enlarged plan view illustrating the region A of FIG. 1.

Referring to FIG. 1, a display device includes a display area DA and a non-display area PA.

An array of pixels PX may be disposed at (e.g., in or on) the display area DA, and the pixels PX may emit light to display an image. For example, the display device may be an organic light-emitting display device, and each of the pixels PX may include an organic light-emitting diode and a driving element for driving the organic light-emitting diode. The driving element may include at least one thin film transistor. The display device may further include an encapsulation layer, which may protect the organic light-emitting diode, and a touch-sensing part (e.g., a touch sensor) disposed on the encapsulation layer.

The non-display area PA may include a peripheral area PA1 adjacent to or surrounding (e.g., around a periphery of) the display area DA, and a bonding area PA2 at (e.g., in or on) which a driving part (e.g., a driver or a driving circuit) DC may be attached (e.g., may be bonded).

The driving part DC may provide a driving signal, for example, such as a data signal, to the pixel array of the display area DA. In an exemplary embodiment, the driving part DC may include a driving chip including an integrated circuit. The driving signal generated by the driving part DC may be provided to the pixel array of the display area DA through a transfer line TL. For example, the transfer line TL may extend along a first direction D1.

In some embodiments, the display device may have an area that is foldable, bendable, and/or the like, such that the area has a folded shape or a bent shape. For example, an area between the peripheral area PA1 and the bonding area PA2 may define (e.g., may form) a bending area PA3 that may have a curvature when folded or bent so that the bonding area PA2 may be disposed underneath the display area DA.

A connection pad electrically connected to the driving part DC may be disposed at (e.g., in or on) the bonding area PA2. For example, a plurality of connection pads may be arranged with a zigzag configuration along a second direction D2 crossing the first direction D1. For example, as shown in FIG. 2, first connection pads CP1 electrically connected to first transfer lines TL1 may be arranged at (e.g., in or on) a first row, and second connection pads CP2 electrically connected to second transfer lines TL2 may be arranged at (e.g., in or on) a second row.

The connection pads CP1 and CP2 may have a multi-layered structure including a plurality of conductive layers. For example, the connection pads CP1 and CP2 may include a combination of conductive layers formed from the same layers as those of at least two from among a gate metal pattern of the driving element, a source metal pattern of the driving element, and a sensing conductive pattern of the touch-sensing part. As used herein, when layers or patterns are described as being formed from the same layer as that of another component or layer, the layers or patterns may include the same or substantially the same material as that of the other component or layer, or may be disposed at (e.g., in or on) the same layer as that of the other component or layer.

Figure 3:
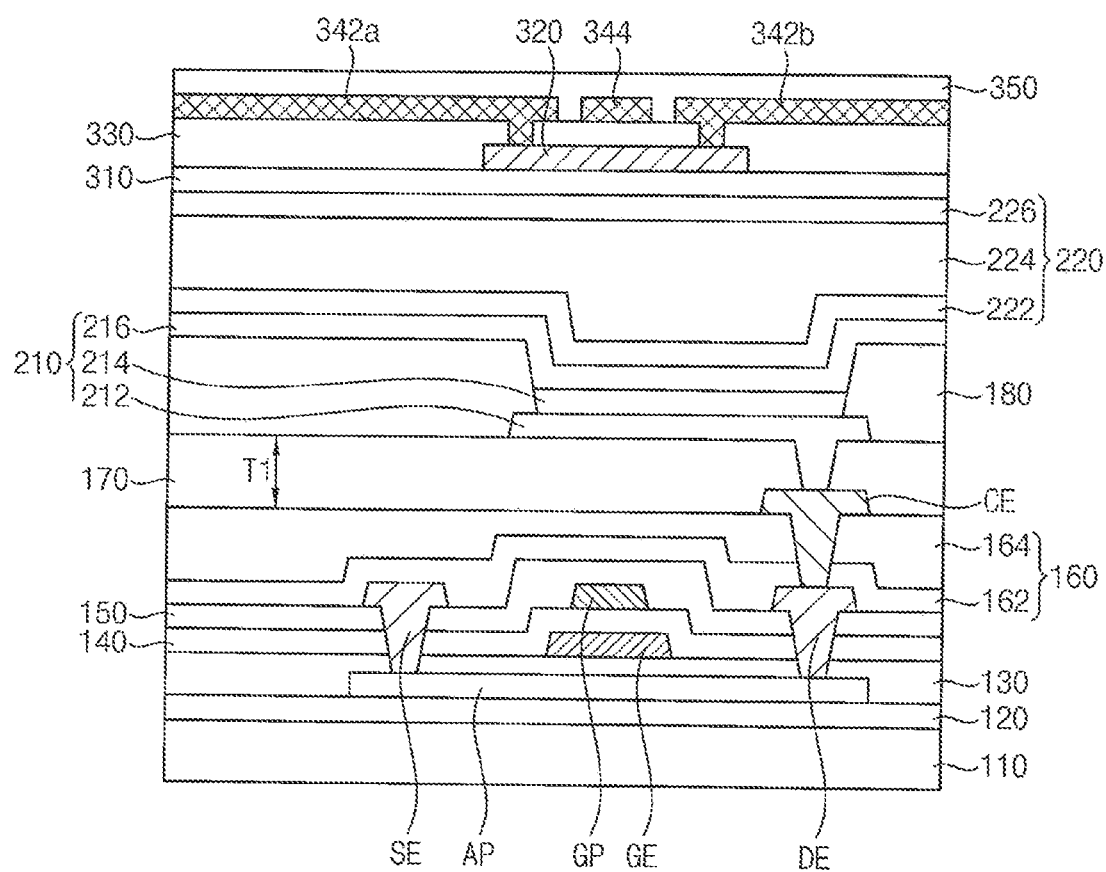
FIG. 3 is a cross-sectional view illustrating a display area of a display device according to an exemplary embodiment.
Figure 4:
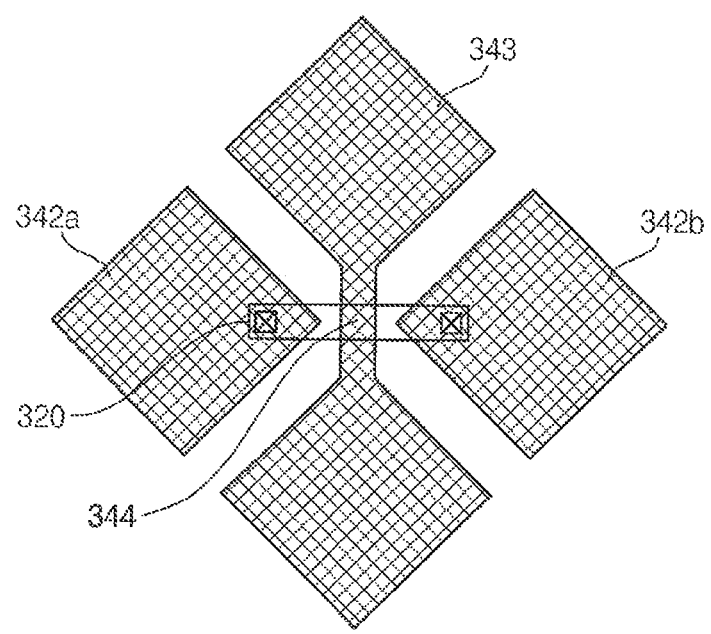
FIG. 4 is a plan view illustrating a sensing electrode of a display device according to an exemplary embodiment.

FIG. 3 is a cross-sectional view illustrating a display area of a display device according to an exemplary embodiment. FIG. 4 is a plan view illustrating a sensing electrode of a display device according to an exemplary embodiment.

Referring to FIG. 3, a buffer layer 120 is disposed on a base substrate 110 at (e.g., in or on) the display area DA. An active pattern AP is disposed on the buffer layer 120. A gate electrode GE is disposed on the active pattern AP. A first insulation layer 130 is disposed between the active pattern AP and the gate electrode GE. The first insulation layer 130 may be referred to as a first gate insulation layer.

A gate wiring pattern GP is disposed on the gate electrode GE. The gate wiring pattern GP may include a capacitor electrode, a signal wiring for transferring a driving signal, and/or the like. A second insulation layer 140 is disposed between the gate electrode GE and the gate wiring pattern GP. The second insulation layer 140 may be referred to as a second gate insulation layer. A third insulation layer 150 is disposed on the gate wiring pattern GP. The third insulation layer 150 may be referred to as an interlayer insulation layer.

A source electrode SE and a drain electrode DE are disposed on the third insulation layer 150. The source electrode SE and the drain electrode DE may extend (e.g., may pass) through one or more of the insulation layers disposed thereunder to be electrically connected to (e.g., to contact) the active pattern AP. For example, the source electrode SE and the drain electrode DE may extend (e.g., may pass) through each of the first, second, and third insulation layers 130, 140, and 150 to contact a portion of a top surface of the active pattern AP. A fourth insulation layer 160 is disposed on a first source metal pattern including the source electrode SE and the drain electrode DE. In an exemplary embodiment, the fourth insulation layer 160 may include an inorganic layer 162, and an organic layer 164 disposed on the inorganic layer 162. The fourth insulation layer 160 may be referred to as a first via insulation layer.

A second source metal pattern including a connection electrode CE is disposed on the fourth insulation layer 160. The connection electrode CE may be electrically connected to (e.g., may contact) the drain electrode DE. The second source metal pattern may further include a mesh power line to compensate for a voltage drop of a current applied to an organic light-emitting diode. A fifth insulation layer 170 is disposed on the second source metal pattern. The fifth insulation layer 170 may be referred to as a second via insulation layer.

An organic light-emitting diode 210 is disposed on the fifth insulation layer 170. For example, a first electrode 212 of the organic light-emitting diode 210 may be disposed on the fifth insulation layer 170. The first electrode 212 may be electrically connected to (e.g., may contact) the connection electrode CE. In another exemplary embodiment, the connection electrode CE may be omitted, and the first electrode 212 may be electrically connected to (e.g., may contact) the drain electrode DE directly.

An organic light-emitting layer 214 is disposed on the first electrode 212. For example, at least a portion of the organic light-emitting layer 214 may be disposed at (e.g., in or on) an opening of a pixel-defining layer 180. A second electrode 216 is disposed on the organic light-emitting layer 214.

An encapsulation layer 220 is disposed on the organic light-emitting layer 214. For example, the encapsulation layer 220 may have a stacked structure including at least one organic thin film and at least one inorganic thin film. For example, as illustrated in FIG. 3, the encapsulation layer 220 may include a first inorganic thin film 222, an organic thin film 224 disposed on the first inorganic thin film 222, and a second inorganic thin film 226 disposed on the organic thin film 224. However, the inventive concept is not limited thereto. For example, in another exemplary embodiment, the encapsulation layer 220 may include at least two organic thin films and at least three inorganic thin films, and the organic thin films may be alternately stacked with the inorganic thin films.

In an exemplary embodiment, a touch-sensing part (e.g., a touch sensor) may be disposed on the encapsulation layer 220. For example, the touch-sensing part may sense an external input by detecting a variation of a capacitance, thereby obtaining coordinate information of the external input.

For example, the touch-sensing part may include a lower touch insulation layer 310, a first sensing conductive pattern, a touch interlayer insulation layer 330, a second sensing conductive pattern, and a protective layer 350.

The first sensing conductive pattern may be disposed on the lower touch insulation layer 310. The first sensing conductive pattern may include a bridge pattern 320. The touch interlayer insulation layer 330 may be disposed on the first sensing conductive pattern. The second sensing conductive pattern may be disposed on the touch interlayer insulation layer 330. The protective layer 350 may cover the second sensing conductive pattern.

Referring to FIGS. 3 and 4, the second sensing conductive pattern may include a first sensing electrode and a second sensing electrode. The first sensing electrode may be electrically insulated from the second sensing electrode. For example, the first sensing electrode may include an array of electrode patterns arranged along a first direction. The second sensing electrode may include an array of electrode patterns arranged along a second direction crossing the first direction.

For example, the first sensing electrode may include a first electrode pattern 342a and a second electrode pattern 342b, which are spaced apart from each other along a direction (e.g., along the D2 direction). The first electrode pattern 342a and the second electrode pattern 342b may be electrically connected to (e.g., may contact) the bridge pattern 320 through via holes extending through (e.g., passing through) the touch interlayer insulation layer 330. Thus, the first electrode pattern 342a and the second electrode pattern 342b may be electrically connected to each other (e.g., by the bridge pattern 320).

The second sensing electrode may include a plurality of electrode patterns 343, and a connection portion 344 disposed at (e.g., in or on) a same layer as that of the electrode patterns 343. The connection portion 344 may be connected to (e.g., continuously connected to) the electrode patterns 343. For example, the connection portion 344 may extend between or may be unitarily formed with the plurality of electrode patterns 343, but the present inventive concept is not limited thereto.

The inventive concept is not limited to the exemplary embodiments illustrated in FIGS. 3 and 4. For example, a touch-sensing part (e.g., a touch sensor) may have various suitable configurations as known to those skilled in the art. For example, in another exemplary embodiment, the lower touch insulation layer 310 may be omitted. In addition, electrode patterns that are adjacent to each other in the first sensing electrode may be connected to a plurality of bridge patterns. Furthermore, the first sensing electrode and the second sensing electrode may be disposed at (e.g., in or on) different layers from each other, so that the first sensing electrode may have a continuous shape (e.g., may have a unitary shape) without a bridge pattern.

Figure 5:
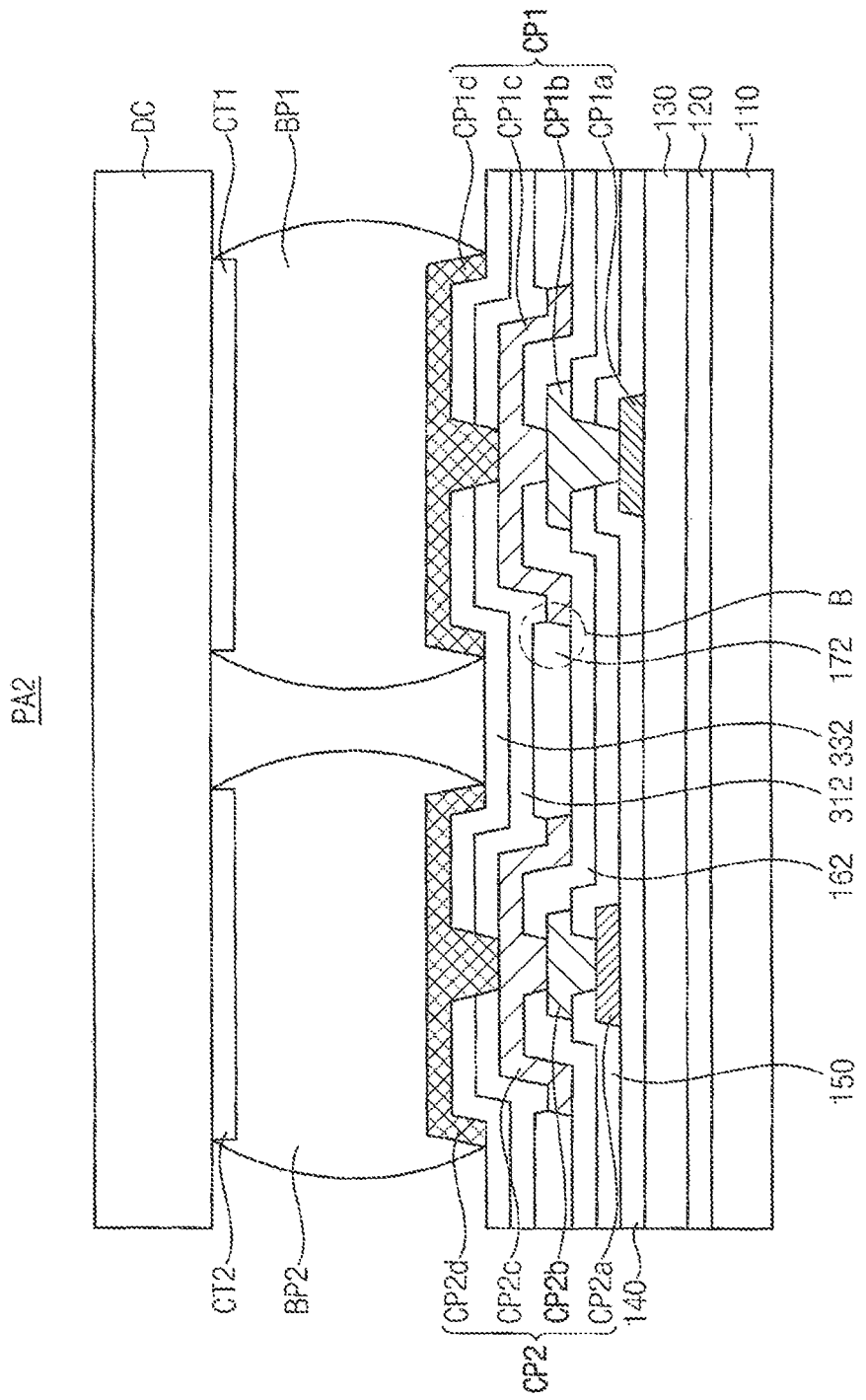
FIG. 5 is a cross-sectional view illustrating a bonding area of a display device according to an exemplary embodiment.
Figure 6:
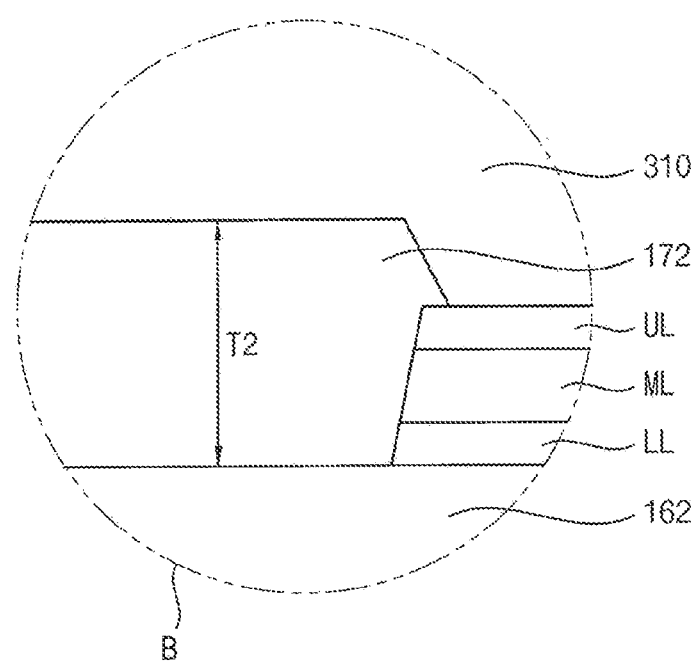
FIG. 6 is an enlarged cross-sectional view illustrating the region B of FIG. 5.

FIG. 5 is a cross-sectional view illustrating a bonding area of a display device according to an exemplary embodiment. FIG. 6 is an enlarged cross-sectional view illustrating the region B of FIG. 5.

Referring to FIG. 5, connection pads CP1 and CP2 are disposed on a base substrate 110 at (e.g., in or on) a bonding area PA2. In one or more exemplary embodiments, the connection pads CP1 and CP2 may include lower conductive layers CP1a and CP2a, first intermediate conductive layers CP1b and CP2b, second intermediate conductive layers CP1c and CP2c, and upper conductive layers CP1d and CP2d, respectively.

In an exemplary embodiment, the lower conductive layer CP1a of a first connection pad CP1 may be formed from the same layer as that of a first gate metal pattern disposed at (e.g., in or on) the display area. For example, the lower conductive layer CP1a may be disposed between a first insulation layer 130 and a second insulation layer 140. The lower conductive layer CP2a of a second connection pad CP2 may be formed from the same layer as that of a second gate metal pattern disposed at (e.g., in or on) the display area. For example, the lower conductive layer CP2a may be disposed between the second insulation layer 140 and a third insulation layer 150.

The first intermediate conductive layers CP1b and CP2b of the connection pads CP1 and CP2 may be formed from the same layer as that of a first source metal pattern disposed at (e.g., in or on) the display area. For example, the first intermediate conductive layers CP1b and CP2b may be disposed between the third insulation layer 150 and a fourth insulation layer. The fourth insulation layer may include an inorganic layer 162 without an organic layer.

The second intermediate conductive layers CP1c and CP2c of the connection pads CP1 and CP2 may be formed from the same layer as that of a second source metal pattern disposed at (e.g., in or on) the display area. For example, the second intermediate conductive layers CP1c and CP2c may be disposed on the fourth insulation layer (e.g., the inorganic layer 162 of the fourth insulation layer).

The upper conductive layers CP1d and CP2d of the connection pads CP1 and CP2 may be formed from the same layer as that of a sensing conductive pattern of the touch-sensing part disposed at (e.g., in or on) the display area. For example, the upper conductive layers CP1d and CP2d may be formed from the same layer as that of a second sensing conductive pattern.

A cladding layer 172 is disposed at (e.g., in or on) the bonding area PA2 to cover at least a portion of the second intermediate conductive layers CP1c and CP2c. In an exemplary embodiment, the cladding layer 172 may be formed from the same layer as that of the fifth insulation layer 170 (e.g., see FIG. 3), and may include an organic material. In an exemplary embodiment, the cladding layer 172 may cover at least side surfaces of the second intermediate conductive layers CP1c and CP2c. For example, as shown in FIG. 5, the cladding layer 172 may be disposed between the second intermediate conductive layers CP1c and CP2c, and may cover at least the side surfaces of the second intermediate conductive layers CP1c and CP2c that face each other.

A passivation layer including an inorganic material may be disposed on the cladding layer 172. For example, the passivation layer may be formed from the same layer as that of the lower touch insulation layer 310, the upper touch insulation layer 330, or a combination thereof. In an exemplary embodiment, the passivation layer may include a lower passivation layer 312 and an upper passivation layer 332. The passivation layer may extend to be partially disposed under the upper conductive layers CP1d and CP2d. For example, the passivation layer may partially overlap with each of the upper conductive layers CP1d and CP2d.

A driving part (e.g., a driver or a driving circuit) DC including a driving chip may be attached to (e.g., bonded on) the bonding area PA2. The driving part DC may be attached to (e.g., bonded on) and electrically connected to the connection pads CP1 and CP2 by conductive bonding members BP1 and BP2. For example, the conductive bonding members BP1 and BP2 may include (e.g., may be) metal bumps. The conductive bonding members BP1 and BP2 may be electrically connected to the connection pads CP1 and CP2 and to connection terminals CT1 and CT2 of the driving part DC, so that driving signals may be transferred to the connection pads CP1 and CP2 from the driving part DC. In another exemplary embodiment, an anisotropic conductive film including conductive balls or the like may be used for the conductive bonding member.

Referring to FIG. 6, each of the second intermediate conductive layers CP1c and CP2c may include an upper layer UL, an intermediate layer ML, and a lower layer LL. In an exemplary embodiment, the upper layer UL and the lower layer LL may include a metal having a relatively small ionization tendency, for example, such as titanium. The intermediate layer ML may include a metal having a relatively large ionization tendency, for example, such as aluminum.

The cladding layer 172 covers at least a side surface of the second intermediate conductive layers CP1c and CP2c. Thus, at least a portion of an upper surface of the upper layer UL may be exposed without being covered by the cladding layer 172, and the intermediate layer ML may not be exposed.

In an exemplary embodiment, a thickness T2 of the cladding layer 172 may be less than (e.g., smaller than) a thickness T1 of the fifth insulation layer 170 (e.g., see FIG. 3). Thus, a height of an upper surface of the cladding layer 172 may be lower than a height of an upper surface of the upper conductive layers CP1d and CP2d. In an exemplary embodiment, the height of the upper surface of the cladding layer 172 may be lower than a height of an upper surface of the second intermediate conductive layers CP1c and CP2c. For example, the thickness T2 of the cladding layer 172 may be less than or equal to 1 μm (e.g., 1 micro-meter), and may be greater than a thickness of the second intermediate conductive layers CP1c and CP2c.

FIGS. 7 to 16 are cross-sectional views illustrating a method for manufacturing a display device according to an exemplary embodiment.

Figure 7:
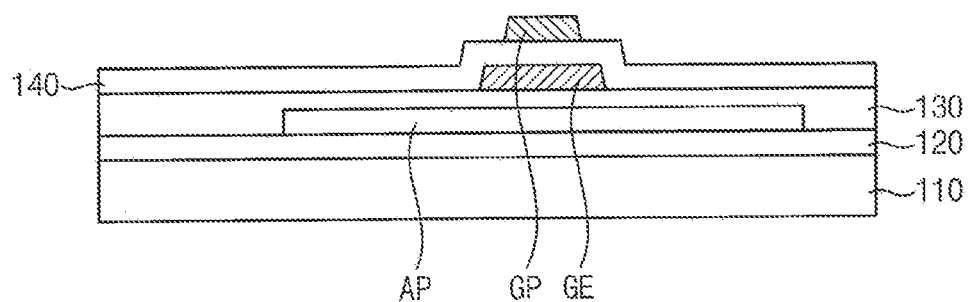
FIGS. 7-16 are cross-sectional views illustrating a method for manufacturing a display device according to an exemplary embodiment.

Referring to FIG. 7, a buffer layer 120 is formed on a base substrate 110 at (e.g., in or on) a display area DA.

For example, the base substrate 110 may include glass, quartz, silicon, a polymeric material, and/or the like. In an exemplary embodiment, the base substrate 110 may be a flexible substrate including the polymeric material. For example, the polymeric material may include polyethylene terephthalate, polyethylene naphthalate, polyether ketone, polycarbonate, polyarylate, polyether sulfone, polyimide, or a combination thereof.

The buffer layer 120 may prevent or reduce penetration of impurities, humidity, and/or external gas from underneath the base substrate 110, and may planarize an upper surface of the base substrate 110. For example, the buffer layer 120 may include an inorganic material such as silicon oxide, silicon nitride, and/or the like, or a combination thereof.

An active pattern AP is formed on the buffer layer 120.

For example, the active pattern AP may include a semiconductive material, such as amorphous silicon, polycrystalline silicon (polysilicon), a metal oxide, and/or the like. When the active pattern AP includes polysilicon, at least a portion of the active pattern AP may be doped with impurities, for example, such as n-type impurities or p-type impurities.

In another exemplary embodiment, the active pattern AP may include a metal oxide semiconductor. For example, the active pattern AP may include a two-component compound (ABx), a ternary compound (ABxCy), or a four-component compound (ABxCyDz), which may include indium (In), zinc (Zn), gallium (Ga), tin (Sn), titanium (Ti), aluminum (Al), hafnium (Hf), zirconium (Zr), magnesium (Mg), and/or the like. For example, the active pattern may include zinc oxide (ZnOx), gallium oxide (GaOx), titanium oxide (TiOx), tin oxide (SnOx), indium oxide (InOx), indium-gallium oxide (IGO), indium-zinc oxide (IZO), indium tin oxide (ITO), gallium zinc oxide (GZO), zinc magnesium oxide (ZMO), zinc tin oxide (ZTO), zinc zirconium oxide (ZnZrxOy), indium-gallium-zinc oxide (IGZO), indium-zinc-tin oxide (IZTO), indium-gallium-hafnium oxide (IGHO), tin-aluminum-zinc oxide (TAZO), indium-gallium-tin oxide (IGTO), and/or the like.

A first insulation layer 130 is formed on the active pattern AP. A first gate metal pattern including a gate electrode GE is formed on the first insulation layer 130. The gate electrode GE overlaps with the active pattern AP. A second insulation layer 140 is formed to cover the first gate metal pattern. A second gate metal pattern including a gate wiring pattern GP is formed on the second insulation layer 140.

For example, the first insulation layer 130 and the second insulation layer 140 may each include silicon oxide, silicon nitride, silicon carbide, or a combination thereof. Furthermore, the first insulation layer 130 and the second insulation layer 140 may include an insulating metal oxide, for example, such as aluminum oxide, tantalum oxide, hafnium oxide, zirconium oxide, titanium oxide, and/or the like. For example, the first insulation layer 130 and the second insulation layer 140 may each have a single-layer structure or a multi-layered structure, which may include silicon nitride and/or silicon oxide.

For example, the first gate metal pattern and the second gate metal pattern may each include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta), or an alloy thereof. The first gate metal pattern and the second gate metal pattern may each have a single-layer structure or a multi-layered structure including different metal layers that are stacked on one another.

Figure 8:
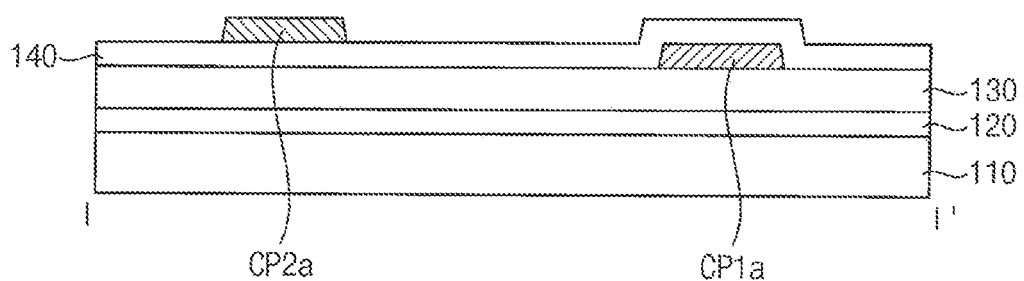

Referring to FIG. 8, lower conductive layers of connection pads are formed at (e.g., in or on) the bonding area PA2.

In an exemplary embodiment, a lower conductive layer CP1a of a first connection pad may be formed from the same layer as that of the first gate metal pattern, and a lower conductive layer CP2a of a second connection pad may be formed from the same layer as that of the second gate metal pattern. Thus, the lower conductive layer CP1a of the first connection pad may be disposed between the first insulation layer 130 and the second insulation layer 140, and the lower conductive layer CP2a of the second connection pad may be disposed on the second insulation layer 140.

Furthermore, the transfer lines TL1 and TL2 illustrated in FIG. 2 may be formed from the same layers as those of the first gate metal pattern and the second gate metal pattern, respectively, and may be connected to (e.g., may be continuously connected to) corresponding lower conductive layers CP1a and CP2a. At least a portion of the transfer lines TL1 and TL2 may be formed from a different layer from those of the gate electrode GE and the gate wiring pattern GP. For example, the transfer lines TL1 and TL2 may include a bridge formed from the same layer as that of a first source metal pattern or a second source metal pattern.

Figure 9:
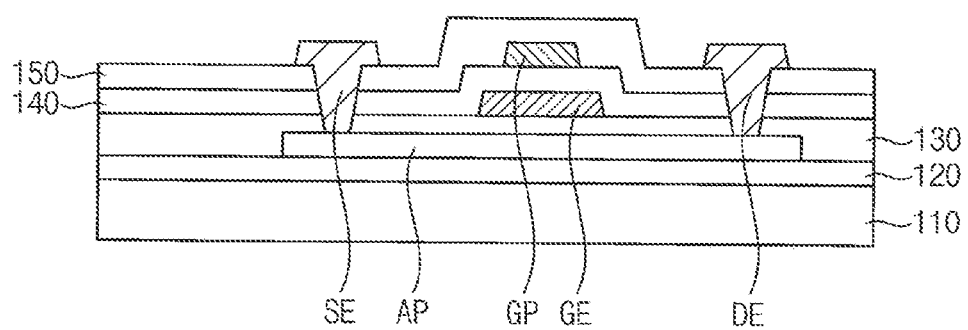

Referring to FIG. 9, a third insulation layer 150 is formed at (e.g., in or on) the display area DA to cover the second gate metal pattern. Thereafter, a first source metal pattern is formed on the third insulation layer 150. The first source metal pattern may include a source electrode SE and a drain electrode DE, which are electrically connected to (e.g., electrically contact) the active pattern AP. For example, the source electrode SE and the drain electrode DE may extend (e.g., may pass) through the third insulation layer 150, the second insulation layer 140, and the first insulation layer 130 to be electrically connected to (e.g., to electrically contact) the active pattern AP.

Figure 10:
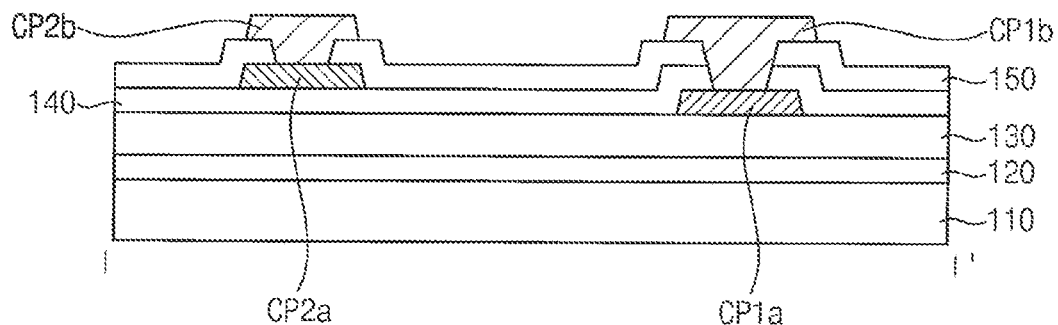

Referring to FIG. 10, first intermediate conductive layers of the connection pads are formed at (e.g., in or on) the bonding area PA2.

In an exemplary embodiment, a first intermediate conductive layer CP1b of the first connection pad and a first intermediate conductive layer CP2b of the second connection pad may be formed from the same layer as that of the first source metal pattern including the source electrode SE and the drain electrode DE. Thus, the first intermediate conductive layers CP1b and CP2b may be disposed on the third insulation layer 150.

For example, the first intermediate conductive layer CP1b of the first connection pad may extend (e.g., may pass) through the third insulation layer 150 and the second insulation layer 140 to be electrically connected to the lower conductive layer CP1a. The first intermediate conductive layer CP2b of the second connection pad may extend (e.g., may pass) through the third insulation layer 150 to be electrically connected to the lower conductive layer CP2a.

Figure 11:
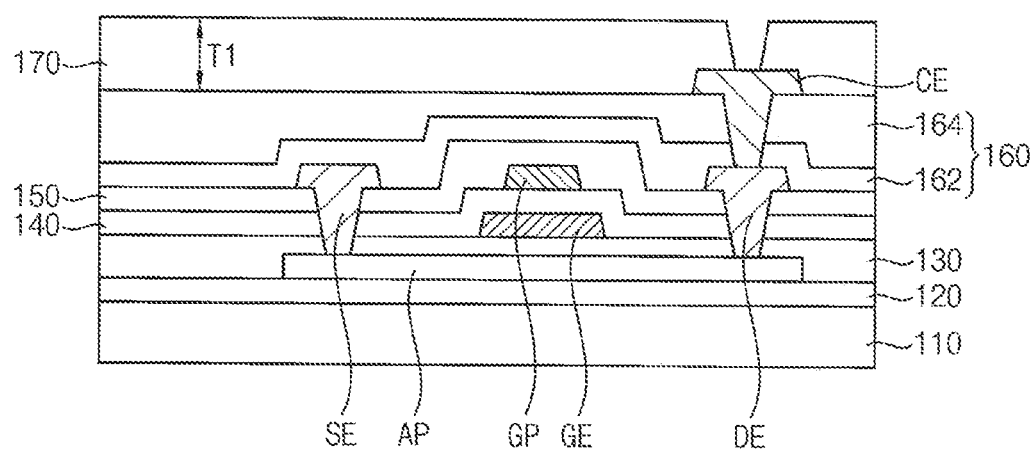

Referring to FIG. 11, a fourth insulation layer 160 is formed to cover the first source metal pattern. In an exemplary embodiment, the fourth insulation layer 160 may include an inorganic layer 162 disposed on the first source metal pattern, and an organic layer 164 disposed on the inorganic layer 162. For example, in an exemplary embodiment, the inorganic layer 162 of the fourth insulation layer 160 may be disposed between the first source metal pattern and the organic layer 164 to contact the first source metal pattern, but the present inventive concept is not limited thereto. For example, in another exemplary embodiment, the fourth insulation layer 160 may include the organic layer 164 without the inorganic layer 162.

A second source metal pattern is formed on the fourth insulation layer 160. The second source metal pattern may include a connection electrode CE that is electrically connected to (e.g., that electrically contacts) the drain electrode DE. For example, the connection electrode CE may extend (e.g., may pass) through the fourth insulation layer 160 to be electrically connected to (e.g., to electrically contact) the drain electrode DE. The second source metal pattern may further include a mesh power line to compensate for a voltage drop of a current applied to an organic light-emitting diode.

A fifth insulation layer 170 is formed to cover the second source metal pattern. The fifth insulation layer 170 may include an opening to expose at least a portion of an upper surface of the connection electrode CE.

For example, the first source metal pattern and the second source metal pattern may include gold, silver, aluminum, copper, nickel, platinum, magnesium, chromium, tungsten, molybdenum, titanium, tantalum, or an alloy thereof, and may have a single-layer structure or a multi-layered structure including different metal layers. In an exemplary embodiment, the first source metal pattern and the second source metal pattern may include at least a layer including aluminum or aluminum alloy. For example, the first source metal pattern and the second source metal pattern may each have a bi-layered structure of titanium/aluminum or a triple-layered structure of titanium/aluminum/titanium.

For example, each of the third insulation layer 150 and the inorganic layer 162 of the fourth insulation layer 160 may include silicon oxide, silicon nitride, silicon carbide, or a combination thereof. Furthermore, the third insulation layer 150 and the inorganic layer 162 of the fourth insulation layer 160 may include an insulating metal oxide, for example, such as aluminum oxide, tantalum oxide, hafnium oxide, zirconium oxide, titanium oxide, or the like. For example, the third insulation layer 150 and the inorganic layer 162 of the fourth insulation layer 160 may each have a single-layer structure or a multi-layered structure, which may include silicon nitride and/or silicon oxide.

For example, the fifth insulation layer 170 and the organic layer 164 of the fourth insulation layer 160 may include an organic insulation material, such as a phenol resin, an acryl resin, a polyimide resin, a polyamide resin, an epoxy resin, benzocyclobutene, and/or the like.

Figure 12:
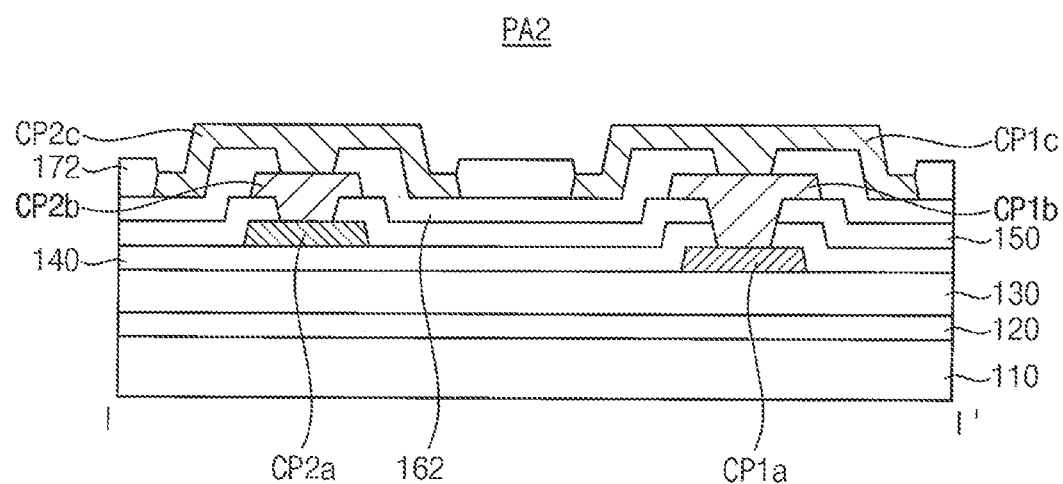

Referring to FIG. 12, second intermediate conductive layers of the connection pads are formed at (e.g., in or on) the bonding area PA2.

In an exemplary embodiment, the fourth insulation layer 160 formed on the first intermediate conductive layers CP1b and CP2b may include the inorganic layer 162 without an organic layer (e.g., without the organic layer 164). For example, during the process of patterning the organic layer 164 at (e.g., in or on) the display area DA, the organic layer 164 disposed at (e.g., in or on) the bonding area PA2 may be removed (e.g., may be entirely removed), or the organic layer 164 may not be disposed at (e.g., in or on) the bonding area PA2.

The second intermediate conductive layers CP1c and CP2c may be formed on the inorganic layer 162, and may extend (e.g., may pass) through the inorganic layer 162 to be electrically connected to (e.g., to electrically contact) the first intermediate conductive layers CP1b and CP2b, respectively. In an exemplary embodiment, the second intermediate conductive layers CP1c and CP2c may be formed from the same layer as that of the connection electrode CE.

A cladding layer 172 is formed at (e.g., in or on) the bonding area PA2 to cover at least a portion of the second intermediate conductive layers CP1c and CP2c. In an exemplary embodiment, the cladding layer 172 may be formed from the same layer as that of the fifth insulation layer 170.

For example, the fifth insulation layer 170 and the cladding layer 172 may be formed by a photolithography process using half-tone light exposure. For example, a photoresist composition may be coated at (e.g., in or on) the display area DA and at (e.g., in or on) the bonding area PA2, and the photoresist composition may be exposed to light such that a light amount for an area corresponding to the fifth insulation layer 170 is different from a light amount for an area corresponding to the cladding layer 172. Thus, the fifth insulation layer 170 and the cladding layer 172 having a thickness different from that of the fifth insulation layer 170 may be formed during the same or substantially the same process.

Figure 13:
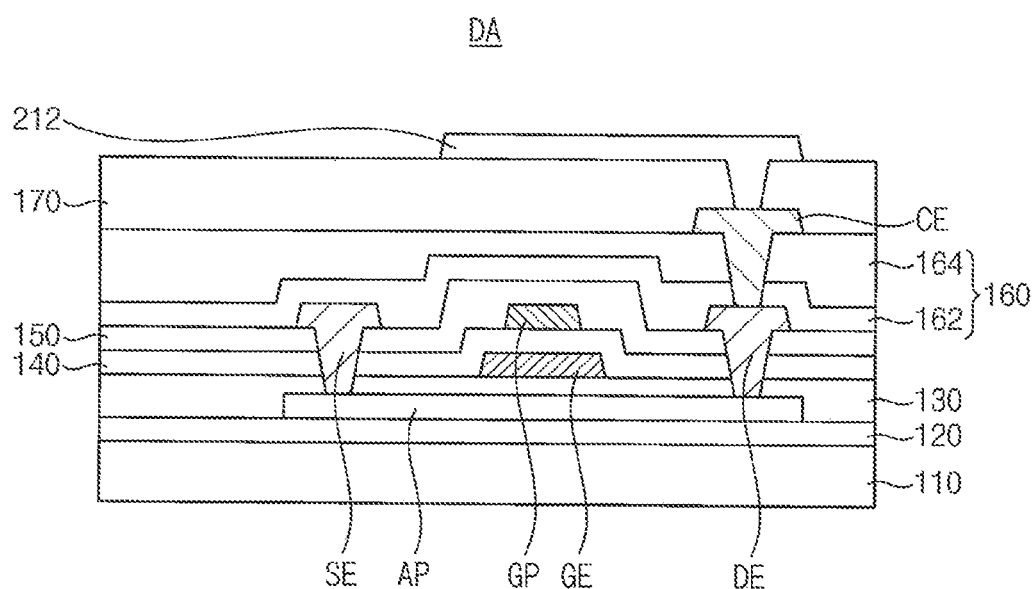
Figure 14:
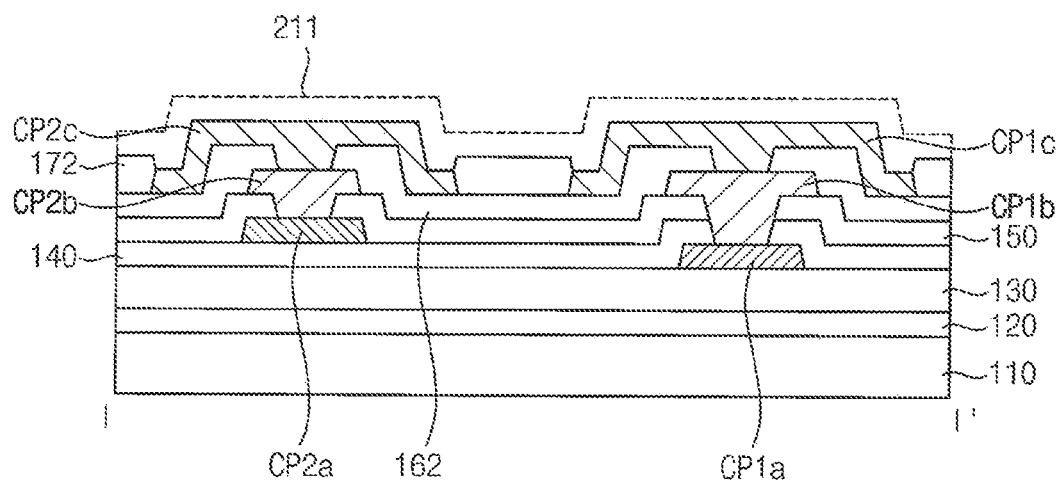

Referring to FIGS. 13 and 14, a lower electrode layer is formed on the fifth insulation layer 170 and the cladding layer 172, and the lower electrode layer may be patterned to form a first electrode 212 of a light-emitting diode at (e.g., in or on) the display area DA. The lower electrode layer 211 may be removed (e.g., may be entirely removed) at (e.g., in or on) the bonding area PA2.

In an exemplary embodiment, the lower electrode layer 211 may have a multi-layered structure including a metal oxide layer and a metal layer. The metal oxide layer may include, for example, indium tin oxide, indium zinc oxide, zinc tin oxide, indium oxide, zinc oxide, tin oxide, or a combination thereof. The metal layer may include, for example, gold, silver, aluminum, copper, nickel, platinum, magnesium, chromium, tungsten, molybdenum, titanium, or a combination thereof.

In an exemplary embodiment, the lower electrode layer 211 may include silver. When the lower electrode layer 211 includes silver, silver ions may be dissolved in an etchant during the process of etching the lower electrode layer 211. When the etchant containing silver ions contact aluminum, which has a larger ionization tendency, silver particles may be formed by Galvanic reduction. The silver particles may be transferred to the first electrode 212, may contaminate a strip apparatus, and/or may cause a short between touch-sensing electrodes formed during one or more later processes. Thus, reliability of a display device may be deteriorated.

According to an exemplary embodiment, the cladding layer 172 covers an aluminum-containing layer of the connection pads. Thus, the silver particles and problems therefrom discussed above may be prevented or substantially prevented. Thus, reliability of a display device may be improved.

Figure 15:
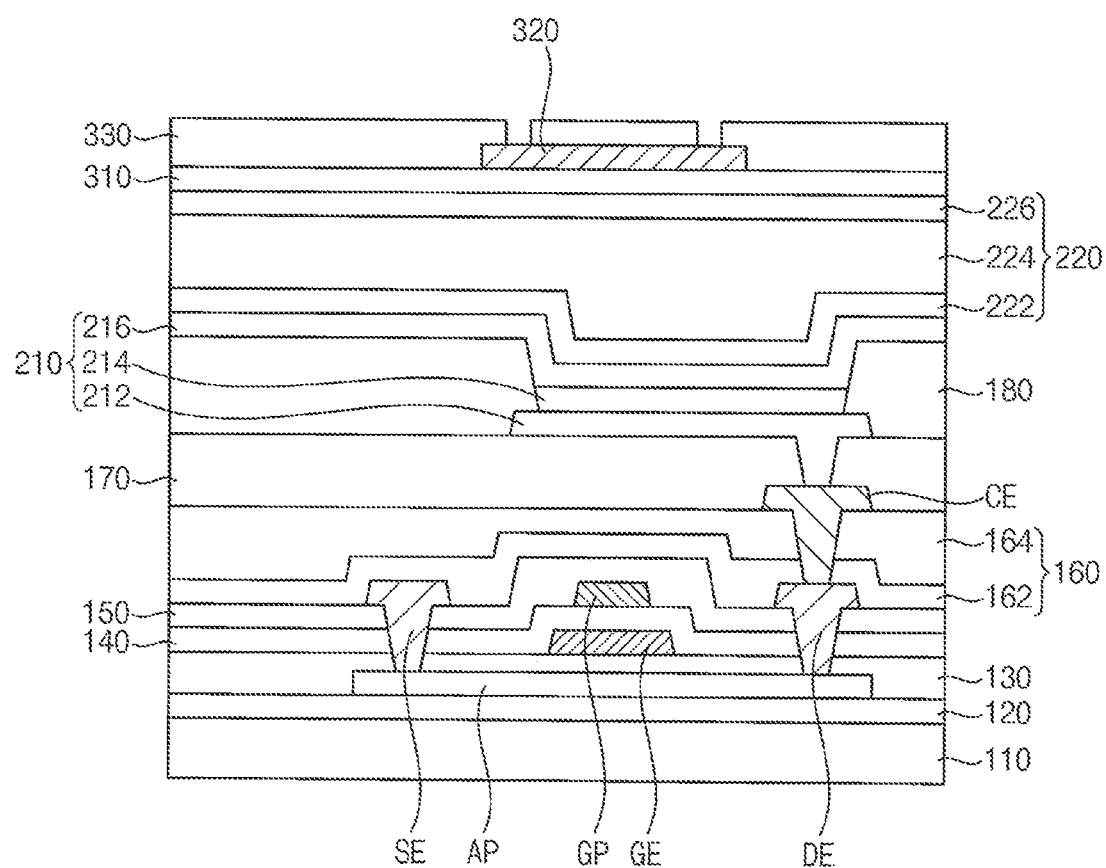

Referring to FIG. 15, a pixel-defining layer 180 is formed at (e.g., in or on) the display area DA. The pixel-defining layer 180 may have an opening that exposes at least a portion of the first electrode 212. For example, the pixel-defining layer 180 may include an organic insulation material that may be used for forming the fifth insulation layer 170 and/or the like.

An organic light-emitting layer 214 is formed on the first electrode 212. For example, the organic light-emitting layer 214 may be formed at (e.g., in or on) the opening of the pixel-defining layer 180. However, the present inventive concept is not limited thereto. For example, the organic light-emitting layer 214 may extend over an upper surface of the pixel-defining layer 180, and/or may be formed as a common layer extending over a plurality of pixels at (e.g., in or on) the display area DA.

The organic light-emitting layer 214 may include at least a light-emitting layer, and may further include at least one of a hole injection layer (HIL), a hole transporting layer (HTL), an electron transporting layer (ETL), and an electron injection layer (EIL). For example, the organic light-emitting layer 214 may include a low molecular weight organic compound or a high molecular weight organic compound.

In an exemplary embodiment, the organic light-emitting layer 214 may emit a red light, a green light, or a blue light. In another exemplary embodiment, the organic light-emitting layer 214 may emit a white light. When the organic light-emitting layer 214 emits a white light, the organic light-emitting layer 214 may have a multi-layered structure including a red-emitting layer, a green-emitting layer, and a blue-emitting layer, or the organic light-emitting layer 214 may have a single-layer structure including a mixture of a red-emitting material, a green-emitting material, and a blue-emitting material.

A second electrode 216 is formed on the organic light-emitting layer 214. The second electrode 216 may be formed as a common layer that extends over a plurality of pixels at (e.g., in or on) the display area DA.

In an exemplary embodiment, the second electrode 216 may function as a cathode. For example, the second electrode 216 may be formed as a transmitting electrode or a reflecting electrode according to an emission type of the display device. For example, when the second electrode 216 is a transmitting electrode, the second electrode 216 may include lithium (Li), calcium (Ca), lithium fluoride, aluminum, magnesium, indium tin oxide, indium zinc oxide, zinc tin oxide, indium oxide, zinc oxide, tin oxide, or a combination thereof.

An encapsulation layer 220 may be disposed on the second electrode 216. For example, the encapsulation layer 220 may include a first inorganic thin film 222, an organic thin film 224 disposed on the first inorganic thin film 222, and a second inorganic thin film 226 disposed on the organic thin film 224.

For example, the organic thin film 224 may include a cured resin, such as polyacrylate and/or the like. For example, the cured resin may be formed from cross-linking reaction of monomers. For example, the inorganic thin films 222 and 226 may include an inorganic material, such as silicon oxide, silicon nitride, silicon carbide, aluminum oxide, tantalum oxide, hafnium oxide, zirconium oxide, titanium oxide, and/or the like.

The pixel-defining layer 180, the organic light-emitting layer 214, the second electrode 216, and the encapsulation layer 220 may not be formed at (e.g., in or on) the bonding area PA2, or may be removed at (e.g., in or on) the bonding area PA2.

In an exemplary embodiment, a touch-sensing part (e.g., a touch sensor) may be formed on the encapsulation layer 220.

For example, a lower touch insulation layer 310 may be formed on the encapsulation layer 220. A first sensing conductive pattern may be formed on the lower touch insulation layer 310. The first sensing conductive pattern may include a bridge pattern 320. A touch interlayer insulation layer 330 may be formed on the first sensing conductive pattern. A via hole may be formed through the touch interlayer insulation layer 330 to expose the bridge pattern 320.

Figure 16:
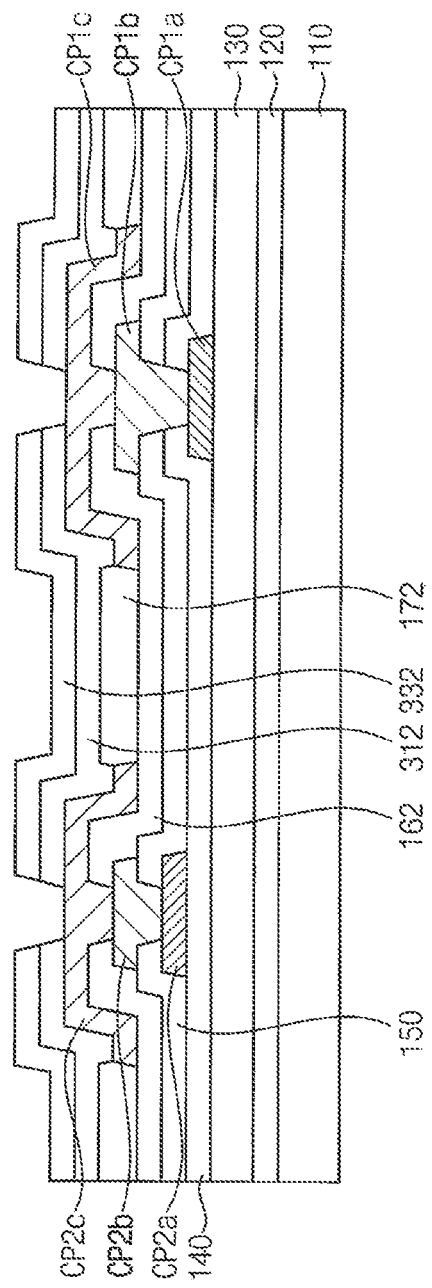

Referring to FIG. 16, a passivation layer is formed on the second intermediate conductive layers CP1c and CP2c and the cladding layer 172 at (e.g., in or on) the bonding area PA2. For example, the passivation layer may include a lower passivation layer 312 formed from the same layer as that of the lower touch insulation layer 310, and an upper passivation layer 332 formed from the same layer as that of the touch interlayer insulation layer 330. The passivation layer may have via holes exposing the second intermediate conductive layers CP1c and CP2c.

Thereafter, as illustrated in FIGS. 3 and 5, a second sensing conductive pattern is formed at (e.g., in or on) the display area DA, and upper conductive layers CP1d and CP2d of the connection pads CP1 and CP2 are formed at (e.g., in or on) the bonding area PA2. The upper conductive layers CP1d and CP2d may extend (e.g., may pass) through the passivation layer to be electrically connected to (e.g., to electrically contact) the second intermediate conductive layers CP1c and CP2c.

The lower touch insulation layer 310 and the touch interlayer insulation layer 330 may each include an inorganic insulation material. For example, the lower touch insulation layer 310 and the touch interlayer insulation layer 330 may each include silicon oxide, silicon nitride, silicon carbide, or a combination thereof. Furthermore, the lower touch insulation layer 310 and the touch interlayer insulation layer 330 may include an insulating metal oxide, for example, such as aluminum oxide, tantalum oxide, hafnium oxide, zirconium oxide, titanium oxide, and/or the like. In an exemplary embodiment, the lower touch insulation layer 310 and the touch interlayer insulation layer 330 may include silicon nitride.

The first sensing conductive pattern and the second sensing conductive pattern include a conductive material. For example, the first sensing conductive pattern and the second sensing conductive pattern may each include a metal, a conductive metal oxide, a conductive polymer, graphene, carbon nano tube, or a combination thereof. For example, the metal may include molybdenum, silver, titanium, copper, aluminum, or an alloy thereof. For example, the metal may be provided to have a shape of a continuous thin film or a nano wire. For example, the conductive metal oxide may include indium tin oxide, indium zinc oxide, zinc tin oxide, indium oxide, zinc oxide, tin oxide, or a combination thereof. The first sensing conductive pattern and the second sensing conductive pattern may each have a single-layer structure or a multi-layered structure including different materials.

Thereafter, a driving part (e.g., a driver or a driving circuit) DC including a driving chip may be attached to (e.g., may be bonded on) the bonding area PA2. In an exemplary embodiment, the driving part DC may be attached to (e.g., may be bonded on) the bonding area PA2 by hot-pressing, supersonic welding, and/or the like, and may be electrically connected to the connection pads CP1 and CP2 by the conductive bonding members BP1 and BP2.

According to one or more exemplary embodiments, the cladding layer 172 including an organic material is not exposed to the exterior (e.g., to the outside). Thus, the cladding layer 172 may be prevented or substantially prevented from absorbing moisture and/or from swelling in an environment with high humidity and/or high temperature. Thus, bonding defects, for example, such as interface separation of the connection pads and the bonding members, may be prevented or reduced.

Furthermore, the cladding layer 172 has a reduced thickness. Thus, protrusion of the cladding layer 172 may be prevented or substantially prevented. Accordingly, effects caused by swelling of the cladding layer 172 may be reduced, and a contact area of the connection pads and the bonding members may be increased.

Figure 17:
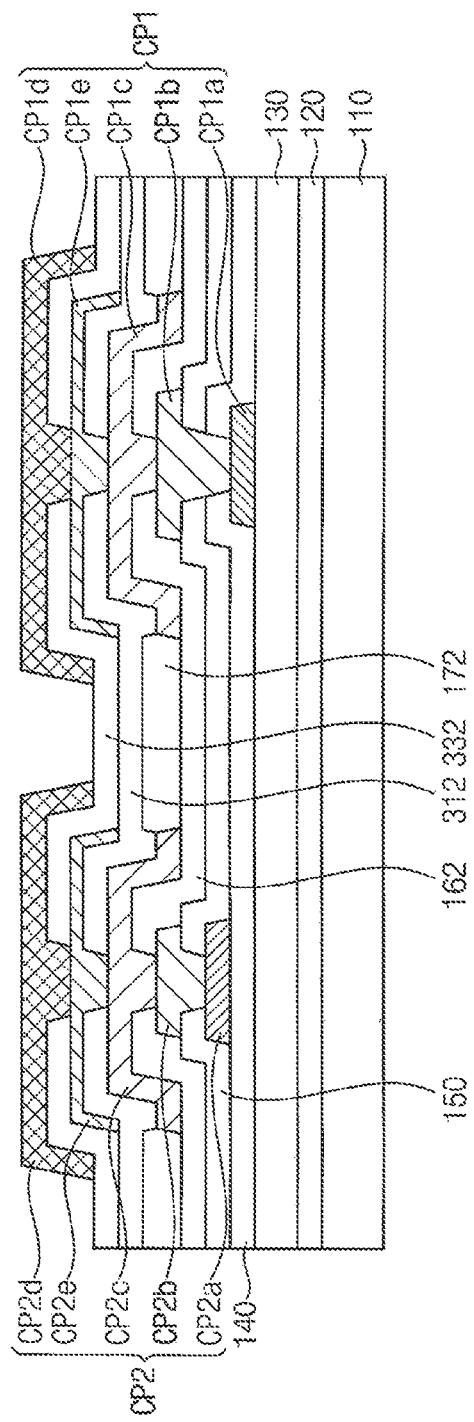
FIGS. 17-18 are cross-sectional views illustrating a display device according to various exemplary embodiments.
Figure 18:
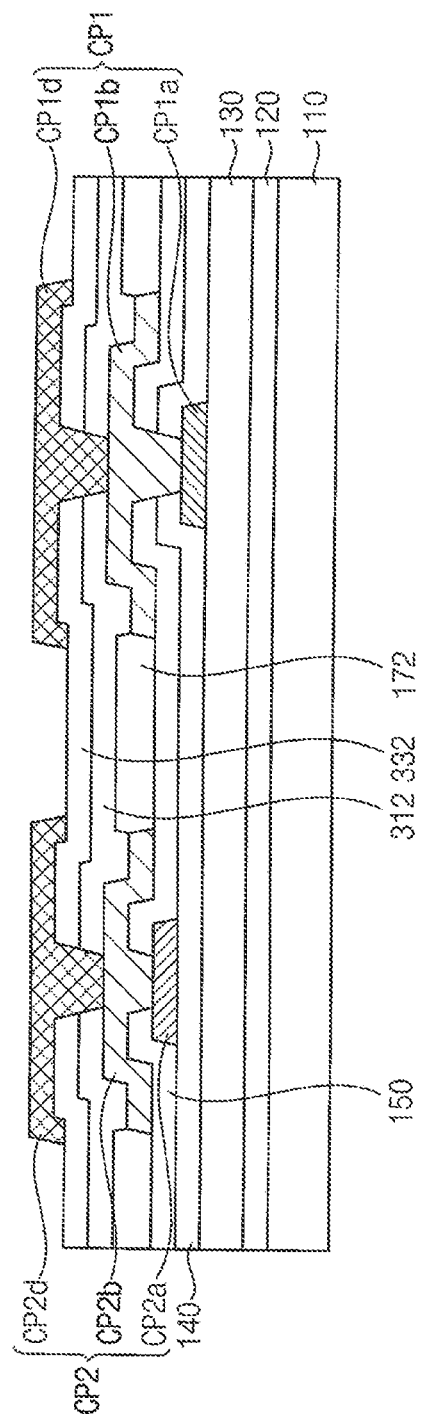

FIGS. 17 and 18 are cross-sectional views illustrating a display device according to various exemplary embodiments.

Referring to FIG. 17, connection pads CP1 and CP2 disposed at (e.g., in or on) a bonding area PA2 may include lower conductive layers CP1a and CP2a, first intermediate conductive layers CP1b and CP2b, second intermediate conductive layers CP1c and CP2c, third intermediate conductive layers CP1e and CP2e, and upper conductive layers CP1d and CP2d, respectively.

In an exemplary embodiment, the lower conductive layer CP1a of a first connection pad CP1 may be formed from the same layer as that of a first gate metal pattern disposed at (e.g., in or on) the display area. For example, the lower conductive layer CP1a may be disposed between the first insulation layer 130 and the second insulation layer 140. The lower conductive layer CP2a of a second connection pad CP2 may be formed from the same layer as that of a second gate metal pattern disposed at (e.g., in or on) the display area. For example, the lower conductive layer CP2a may be disposed between the second insulation layer 140 and the third insulation layer 150.

The first intermediate conductive layers CP1b and CP2b of the connection pads CP1 and CP2 may be formed from the same layer as that of a first source metal pattern disposed at (e.g., in or on) the display area. For example, the first intermediate conductive layers CP1b and CP2b may be disposed between the third insulation layer 150 and the fourth insulation layer. The fourth insulation layer may include an inorganic layer 162 without an organic layer.

The second intermediate conductive layers CP1c and CP2c of the connection pads CP1 and CP2 may be formed from the same layer as that of a second source metal pattern disposed at (e.g., in or on) the display area. For example, the second intermediate conductive layers CP1c and CP2c may be disposed on the fourth insulation layer.

The third intermediate conductive layers CP1e and CP2e of the connection pads CP1 and CP2 may be formed from the same layer as that of a sensing conductive pattern of the touch-sensing part disposed at (e.g., in or on) the display area. For example, the third intermediate conductive layers CP1e and CP2e may be formed from the same layer as that of the first sensing conductive pattern.

The upper conductive layers CP1d and CP2d of the connection pads CP1 and CP2 may be formed from the same layer as that of a sensing conductive pattern of the touch-sensing part disposed at (e.g., in or on) the display area. For example, the upper conductive layers CP1d and CP2d may be formed from the same layer as that of the second sensing conductive pattern.

A cladding layer 172 is disposed at (e.g., in or on) the bonding area PA2 to cover at least a portion of the second intermediate conductive layers CP1c and CP2c. In an exemplary embodiment, the cladding layer 172 may be formed from the same layer as that of a fifth insulation layer disposed at (e.g., in or on) the display area, and may include an organic material. In an exemplary embodiment, the cladding layer 172 may cover at least side surfaces of the second intermediate conductive layers CP1c and CP2c.

A passivation layer including an inorganic material may be disposed on the cladding layer 172. For example, the passivation layer may be formed from the same layer as that of the lower touch insulation layer 310, the upper touch insulation layer 330, or a combination thereof. In an exemplary embodiment, the passivation layer may include a lower passivation layer 312 and an upper passivation layer 332. The passivation layer may extend to be partially disposed under the upper conductive layers CP1d and CP2d.

In an exemplary embodiment, the third intermediate conductive layers CP1e and CP2e may be partially disposed between the lower passivation layer 312 and the upper passivation layer 332.

Referring to FIG. 18, connection pads CP1 and CP2 disposed at (e.g., in or on) a bonding area PA2 may include lower conductive layers CP1a and CP2a, intermediate conductive layers CP1b and CP2b, and upper conductive layers CP1d and CP2d, respectively.

In an exemplary embodiment, the lower conductive layer CP1a of a first connection pad CP1 may be formed from the same layer as that of a first gate metal pattern disposed at (e.g., in or on) the display area. For example, the lower conductive layer CP1a may be disposed between the first insulation layer 130 and the second insulation layer 140. The lower conductive layer CP2a of a second connection pad CP2 may be formed from the same layer as that of a second gate metal pattern disposed at (e.g., in or on) the display area. For example, the lower conductive layer CP2a may be disposed between the second insulation layer 140 and the third insulation layer 150.

The intermediate conductive layers CP1b and CP2b of the connection pads CP1 and CP2 may be formed from the same layer as that of a first source metal pattern or a second source metal pattern, which are disposed at (e.g., in or on) the display area.

The upper conductive layers CP1d and CP2d of the connection pads CP1 and CP2 may be formed from the same layer as that of a sensing conductive pattern of the touch-sensing part disposed at (e.g., in or on) the display area. For example, the upper conductive layers CP1d and CP2d may be formed from the same layer as that of the second sensing conductive pattern.

A cladding layer 172 is disposed at (e.g., in or on) the bonding area PA2 to cover at least a portion of the intermediate conductive layers CP1b and CP2b. In an exemplary embodiment, the cladding layer 172 may include an organic material. In an exemplary embodiment, the cladding layer 172 may cover at least side surfaces of the intermediate conductive layers CP1b and CP2b.

A passivation layer including an inorganic material may be disposed on the cladding layer 172. For example, the passivation layer may be formed from the same layer as that of the lower touch insulation layer 310, the upper touch insulation layer 330, or a combination thereof. In an exemplary embodiment, the passivation layer may include a lower passivation layer 312 and an upper passivation layer 332. The passivation layer may extend to be partially disposed under the upper conductive layers CP1d and CP2d.

As illustrated in FIGS. 17 and 18, the connection pads in one or more exemplary embodiments may have various configurations. However, the present inventive concept is not limited to the examples shown in the exemplary embodiments described herein, and the connection pads may have various suitable or desired configurations as would be known to those skilled in the art within the spirit and scope of the present inventive concept.

For example, when a touch-sensing part (e.g., a touch sensor) of a display device does not include a lower touch insulation layer, a passivation layer at (e.g., in or on) a bonding area may have a single-layer structure.

For example, a layer for forming an upper conductive layer of a connection pad is not limited to a conductive layer for forming a touch-sensing part (e.g., a touch sensor) with a capacitance type, and a conductive layer for forming a touch-sensing part (e.g., a touch sensor) with various suitable types or sensors may be used for forming the upper conductive layer.

For example, a layer for forming a cladding layer is not limited to a second via insulation layer. The cladding layer may be formed from the same layer as that of a first via insulation layer, or may be formed individually.

For example, lower conductive layers of a first connection pad and a second connection pad may be formed from the same layer.

Furthermore, the present inventive concept is not limited thereto a display device including a connection pad including an aluminum-containing layer. For example, the connection pad may include various suitable or desired metals or alloys thereof.

One or more exemplary embodiments of the present inventive concept may be applied to various kinds of display devices. In an exemplary embodiment, for example, one or more exemplary embodiments may be applied to a vehicle-display device, a ship-display device, an aircraft-display device, portable communication devices, display devices for display and/or for information transfer, a medical-display device, and/or the like.

The foregoing is illustrative of exemplary embodiments and is not to be construed as limiting thereof. Although some exemplary embodiments have been described, those skilled in the art will readily appreciate that various modifications are possible in the exemplary embodiments without departing from the aspects and features of the present inventive concept. Accordingly, all such modifications are intended to be included within the spirit and scope of the present inventive concept. Therefore, it is to be understood that the foregoing is illustrative of various exemplary embodiments and is not to be construed as limited to the specific exemplary embodiments disclosed herein, and that various modifications to the disclosed exemplary embodiments, as well as to other exemplary embodiments, are intended to be included within the spirit and scope of the present inventive concept, as set forth in the following claims and equivalents thereof.

What is claimed is:

1. A method for manufacturing a display device comprising a light-emitting element at a display area, a driving element electrically connected to the light-emitting element, and a connection pad at a bonding area, the method comprising:
   forming a lower conductive layer of the connection pad;
   forming an intermediate conductive layer of the connection pad to electrically contact the lower conductive layer;
   forming a cladding layer to cover a side surface of the intermediate conductive layer while exposing an upper surface of the intermediate conductive layer;
   forming a passivation layer to cover an upper surface of the cladding layer; and
   forming an upper conductive layer of the connection pad to electrically contact the intermediate conductive layer,
   wherein the passivation layer covering the upper surface of the cladding layer extends to contact the upper surface of the intermediate conductive layer of the connection pad at the bonding area.

2. The method of claim 1, wherein:
   the lower conductive layer is formed from a same layer as that of a gate electrode of the driving element; and
   the intermediate conductive layer is formed from a same layer as that of a drain electrode of the driving element, or as that of a connection electrode electrically connecting the drain electrode to the light-emitting element.

3. The method of claim 2, wherein the display device further comprises:
   an encapsulation layer covering the light-emitting element; and
   a touch sensor on the encapsulation layer and comprising a sensing conductive pattern, and
   wherein the upper conductive layer is formed from a same layer as that of the sensing conductive pattern.

4. The method of claim 3, wherein the touch sensor comprises:
   a lower touch insulation layer;
   a first sensing conductive pattern on the lower touch insulation layer;
   a touch intermediate insulation layer covering the first sensing conductive pattern; and
   a second sensing conductive pattern on the touch intermediate insulation layer, and
   wherein the upper conductive layer is formed from a same layer as that of the second sensing conductive pattern.

5. The method of claim 4, wherein the passivation layer is formed from a same layer as that of the lower touch insulation layer, the touch intermediate insulation layer, or a combination thereof.

6. The method of claim 2, wherein the cladding layer is formed from an organic insulation layer covering a source metal pattern of the driving element, and the cladding layer has a thickness less than that of the organic insulation layer.

7. The method of claim 1, wherein the intermediate conductive layer has a multi-layered structure comprising an aluminum-containing layer.

* * * * *